(12) United States Patent
Horiuchi et al.

(10) Patent No.: US 9,780,163 B2
(45) Date of Patent: Oct. 3, 2017

(54) METHOD OF MANUFACTURING SEMICONDUCTOR DEVICE AND SEMICONDUCTOR DEVICE

(71) Applicant: TOYOTA JIDOSHA KABUSHIKI KAISHA, Toyota-shi, Aichi-ken (JP)

(72) Inventors: Yuki Horiuchi, Toyota (JP); Satoru Kameyama, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/307,608

(22) PCT Filed: Apr. 20, 2015

(86) PCT No.: PCT/JP2015/062016
§ 371 (c)(1),
(2) Date: Oct. 28, 2016

(87) PCT Pub. No.: WO2015/194250
PCT Pub. Date: Dec. 23, 2015

(65) Prior Publication Data
US 2017/0092714 A1    Mar. 30, 2017

(30) Foreign Application Priority Data
Jun. 19, 2014  (JP) ................................ 2014-125925

(51) Int. Cl.
*H01L 23/58*    (2006.01)
*H01L 29/06*    (2006.01)
(Continued)

(52) U.S. Cl.
CPC ........ *H01L 29/063* (2013.01); *H01L 21/2253* (2013.01); *H01L 21/26513* (2013.01); *H01L 21/324* (2013.01); *H01L 29/861* (2013.01)

(58) Field of Classification Search
CPC . H01L 29/0634; H01L 29/861; H01L 29/063; H01L 21/26513; H01L 21/2253; H01L 21/324
(Continued)

(56) References Cited

U.S. PATENT DOCUMENTS

2006/0252239 A1*  11/2006  Hierlemann ...... H01L 21/26513
                                                    438/527
2010/0094734 A1*  4/2010   Wang ................... G06Q 20/105
                                                    705/30

FOREIGN PATENT DOCUMENTS

JP        2011-082220 A      4/2011

* cited by examiner

Primary Examiner — Theresa T Doan
(74) Attorney, Agent, or Firm — Oliff PLC

(57) ABSTRACT

A structure having high, middle, and low impurity concentration regions disposed from a surface side of a substrate is more suitably manufactured. A method of manufacturing a semiconductor device includes: a first implantation of first conductivity type impurities into a first conductivity type semiconductor substrate from a surface; melting and solidifying a first semiconductor region between a depth and the surface, wherein the depth is deeper than a depth having a peak impurity concentration in an increased region where the impurity concentration was increased in the first implantation, and shallower than a deeper end of the increased region; a second implantation of the impurities from the surface into a region shallower than the depth; and melting and solidifying a region in which the impurity concentration was increased in the second implantation.

5 Claims, 10 Drawing Sheets

(51) Int. Cl.
*H01L 21/265* (2006.01)
*H01L 21/324* (2006.01)
*H01L 21/225* (2006.01)
*H01L 29/861* (2006.01)

(58) Field of Classification Search
USPC .......................................................... 257/493
See application file for complete search history.

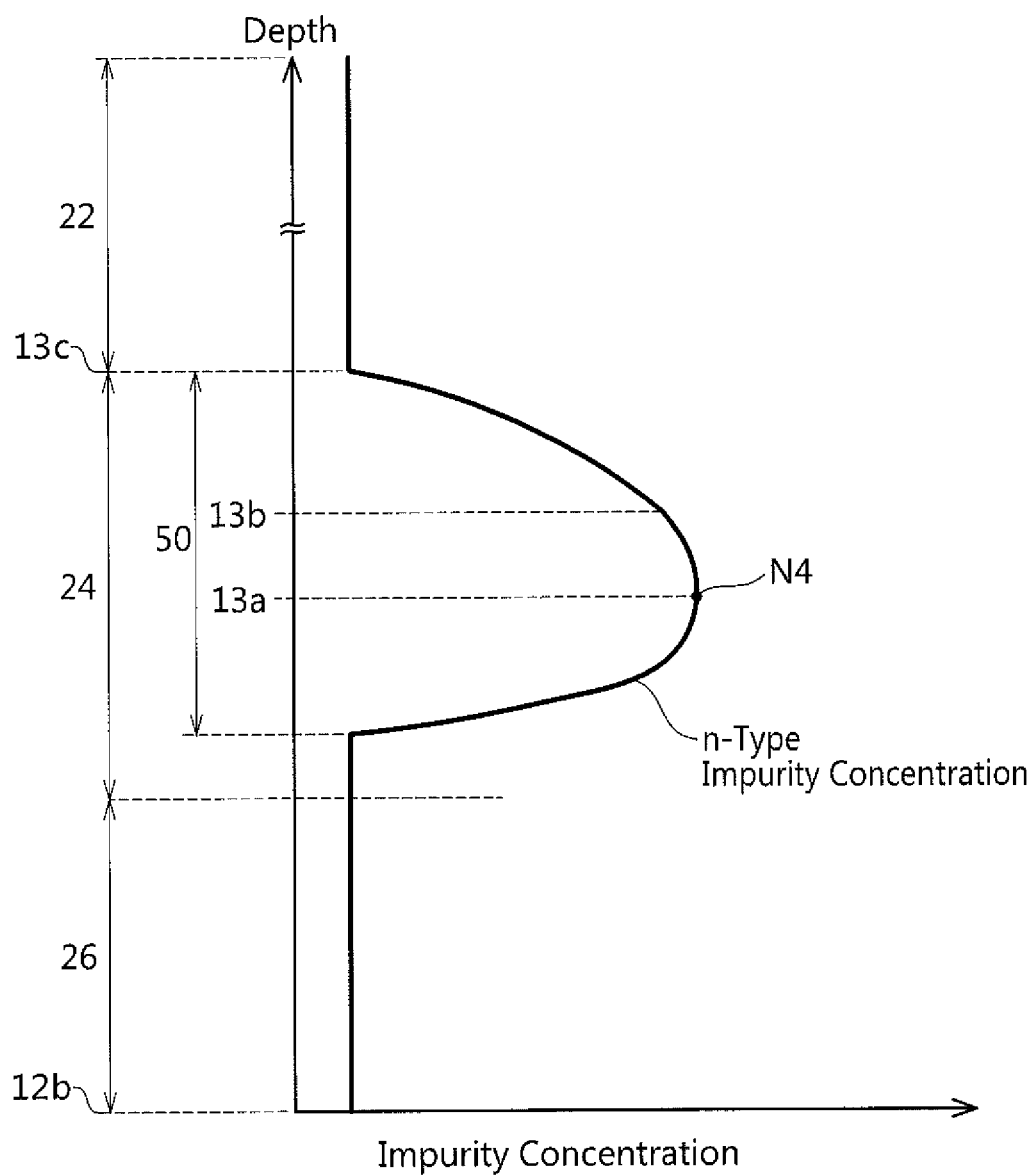

METHOD OF MANUFACTURING SEMICONDUCTOR DEVICE AND SEMICONDUCTOR DEVICE

CROSS-REFERENCE TO RELATED APPLICATION

This application is a related application of Japanese Patent Application No. 2014-125925 filed on Jun. 19, 2014 and claims priority to this Japanese Patent Application, the entire contents of which are hereby incorporated by reference into the present application.

TECHNICAL FIELD

The art disclosed in the present specification relates to a semiconductor device.

BACKGROUND ART

Japanese Patent Application Publication No. 2011-082220 (hereinafter referred to as Patent Literature 1) discloses a semiconductor device that has a cathode layer, a buffer layer, and a drift layer. The cathode layer has a high n-type impurity concentration, and is exposed on a back surface of a semiconductor substrate. The buffer layer has an n-type impurity concentration lower than that of the cathode layer, and is in contact with the cathode layer. The drift layer has an n-type impurity concentration lower than that of the buffer layer, and is in contact with the buffer layer.

SUMMARY OF INVENTION

Technical Problem

A structure in which a high concentration impurity region, a middle concentration impurity region, and a low concentration impurity region are disposed in this order from a surface side of the substrate as in Patent Literature 1, is used in various semiconductor devices such as a diode, a MOSFET, and the like. The present specification provides an art capable of making performances more stable in such semiconductor device.

Solution to Technical Problem

In the art that has been studied by the present inventors, after impurities have been implanted into a semiconductor substrate, the implanted region is melted and then solidified again. The impurities diffuse in an entirety of the melted region, and hence the re-solidified region becomes a region that contains the impurities. Moreover, when the semiconductor substrate is melted as such, crystal defects formed by the impurity implantation can efficiently be eliminated. It is therefore possible to form an impurity region that has a high impurity concentration and a low crystal defect density. However, in the art that melts the surface of the semiconductor substrate as such, it has been revealed that impurities adhered to the surface of the semiconductor substrate before the melting diffuse in the melted region, and a region of an unintentional conductivity type is formed. For example, when an n-type region is to be formed, there may be a case where p-type impurities adhering to the surface of the semiconductor substrate diffuse in the melted region. The p-type impurities that diffuse as such may cause a part of the semiconductor region to turn into a p-type.

To solve the above-described problem, the present invention provides a method of manufacturing a semiconductor device as described below. This method comprises: a first implantation of implanting first conductivity type impurities into a semiconductor substrate of a first conductivity type from a surface of the semiconductor substrate; melting and then solidifying a first semiconductor region between a specific depth and the surface, the specific depth being deeper than a depth having a peak concentration of the first conductivity type impurities in an increased region in which a first conductivity type impurity concentration was increased in the first implantation, and the specific depth being shallower than a deeper side end of the increased region; a second implantation of implanting, from the surface, the first conductivity type impurities into a region shallower than the specific depth; and melting and then solidifying a region in which the first conductivity type impurity concentration was increased in the second implantation.

Notably, "deep" in the present specification means a side farther from the above-described surface (i.e., the surface from which the impurities are implanted in the first and second implantations), while "shallow" means a side closer to the above-described surface. Moreover, the above-described "first conductivity type" means any one of the n-type and the p-type.

In this method, when the first semiconductor region is melted and then solidified, the first conductivity type impurities diffuse in an entirety of the first semiconductor region. Moreover, at this occasion, impurities of other conductivity type (hereinafter referred to as second conductivity type impurities) adhering to the surface of the semiconductor substrate also diffuse in the entirety of the first semiconductor region. Before the melting, the first semiconductor region includes the depth having the peak concentration of the first conductivity type impurity concentration, and hence after the solidification, the entirety of the first semiconductor region comes to have a relatively high first conductivity type impurity concentration. Accordingly, after the solidification, the first conductivity type impurity concentration can be prevented from being lower than the second conductivity type impurity concentration in the first semiconductor region. Moreover, the first semiconductor region is shallower than the deeper side end of the increased region, and hence even a region deeper than the first semiconductor region has the first conductivity type impurity concentration that is high to some extent. Accordingly, even if the second conductivity type impurities diffuse from the first semiconductor region to a deeper side in the process of melting and solidification described above, the region deeper than the first semiconductor region can be prevented from turning into the second conductivity type. Therefore, according to this method, unintentional formation of a second conductivity type region can be prevented.

Moreover, the present invention provides a semiconductor device. This semiconductor device comprises: a high concentration region of a first conductivity type provided in a range exposed on a surface of a semiconductor substrate; a middle concentration region of the first conductivity type provided in a range deeper than the high concentration region, and having a first conductivity type impurity concentration which is lower than that of the high concentration region; and a low concentration region of the first conductivity type provided in a range deeper than the middle concentration region, and having the first conductivity type impurity concentration which is lower than that of the middle concentration region. A distance A is a distance from a depth having a peak value of the first conductivity type impurity concentration in the high concentration region to a depth deeper than the depth having the peak value of the first conductivity type impurity concentration, and having the first conductivity type impurity concentration which is one tenth of the peak value of the first conductivity type impurity concentration. The first conductivity type impurity concentration at a depth shallower by twice the distance A than the depth having the peak value of the first conductivity type impurity concentration is equal to or higher than one tenth of the peak value of the first conductivity type impurity concentration. A distance B is a distance from a depth having a peak value of a p-type impurity concentration in the middle concentration region to a depth deeper than the depth having the peak value of the p-type impurity concentration, and having the p-type impurity concentration which is one tenth of the peak value of the p-type impurity concentration. The p-type impurity concentration at a depth shallower by twice the distance B than the depth having the peak value of the p-type impurity concentration is equal to or higher than one tenth of the peak value of the p-type impurity concentration. A distance C is a distance from a depth having a peak value of the first conductivity type impurity concentration in the middle concentration region to a depth deeper than the depth having the peak value of the first conductivity type impurity concentration, and having the first conductivity type impurity concentration which is one tenth of the peak value of the first conductivity type impurity concentration. The distance C is greater than the distance B.

This semiconductor device can be manufactured by the above-described method, and hence in its manufacturing steps, unintentional formation of a p-type region can be prevented.

BRIEF DESCRIPTION OF DRAWINGS

FIG. 11 is a graph that shows an impurity concentration distribution in regions corresponding to FIG. 2 after a first implantation in a manufacturing method in a variation.

DESCRIPTION OF EMBODIMENTS

Initially, features of an embodiment will be listed. Notably, each of the features below has utility independently.

(Feature 1) A first conductivity type impurity concentration is increased in a range between a deeper side end of an increased region and a surface in a first implantation of a manufacturing method.

(Feature 2) First conductivity type impurities are implanted by a channeling implantation in the first implantation of the manufacturing method.

(Feature 3) The first conductivity type impurity concentration continuously decreases from a depth having a peak value of the first conductivity type impurity concentration in a middle concentration region toward a deeper side, in a semiconductor device. A graph of the first conductivity type impurity concentration in a part where the first conductivity type impurity concentration continuously decreases curves in a convex manner toward a plus side of the first conductivity type impurity concentration.

Embodiment

Figure 1:
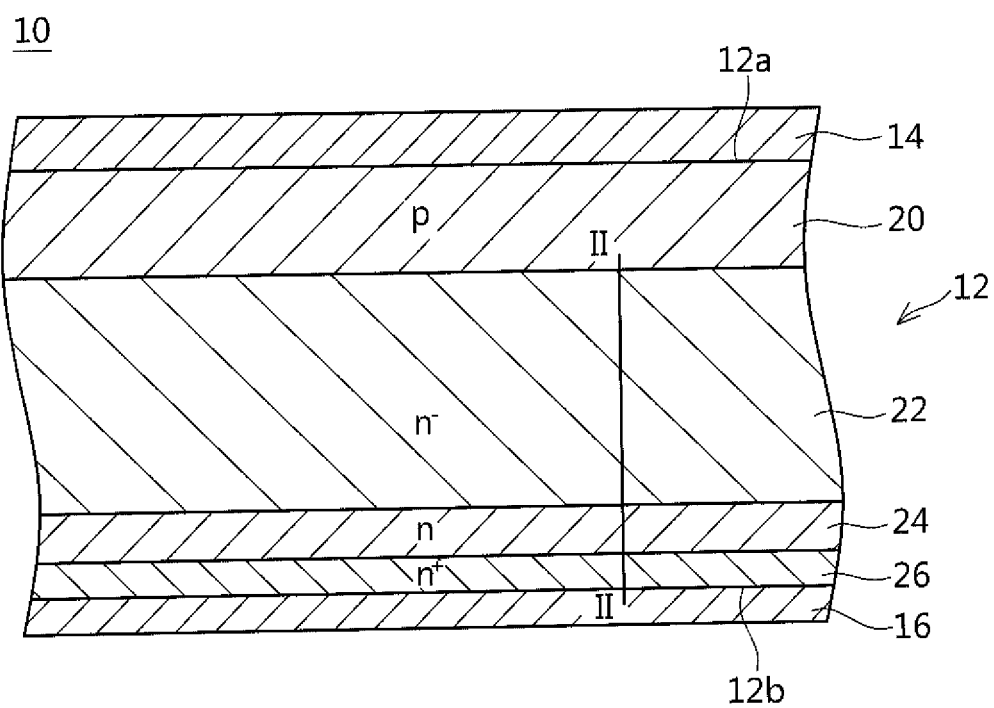
FIG. 1 is a vertical cross-sectional view of a semiconductor device 10.

A semiconductor device 10 of an embodiment shown in FIG. 1 comprises a semiconductor substrate 12, an upper electrode 14, and a lower electrode 16. The upper electrode 14 is provided on an upper surface 12a of the semiconductor substrate 12, and the lower electrode 16 is provided on a lower surface 12b of the semiconductor substrate 12. The semiconductor substrate 12 has an anode region 20, a drift region 22, a buffer region 24, and a cathode region 26 provided therein. A diode is formed by these regions.

The anode region 20 is of a p-type. The anode region 20 is provided in a range exposed on the upper surface 12a of the semiconductor substrate 12. The anode region 20 is in contact with the upper electrode 14.

The drift region 22 is of an n-type. The drift region 22 is provided on an underside of the anode region 20. The drift region 22 is in contact with the anode region 20.

The buffer region 24 is of the n-type. The buffer region 24 has an n-type impurity concentration higher than that of the drift region 22. The buffer region 24 is provided on an underside of the drift region 22. The buffer region 24 is in contact with the drift region 22.

The cathode region 26 is of the n-type. The cathode region 26 has an n-type impurity concentration higher than that of the buffer region 24. The cathode region 26 is provided on an underside of the buffer region 24. The cathode region 26 is provided in a range exposed on the lower surface 12b of the semiconductor substrate 12. The cathode region 26 is in contact with the buffer region 24. Moreover, the cathode region 26 is in contact with the lower electrode 16.

Figure 2:
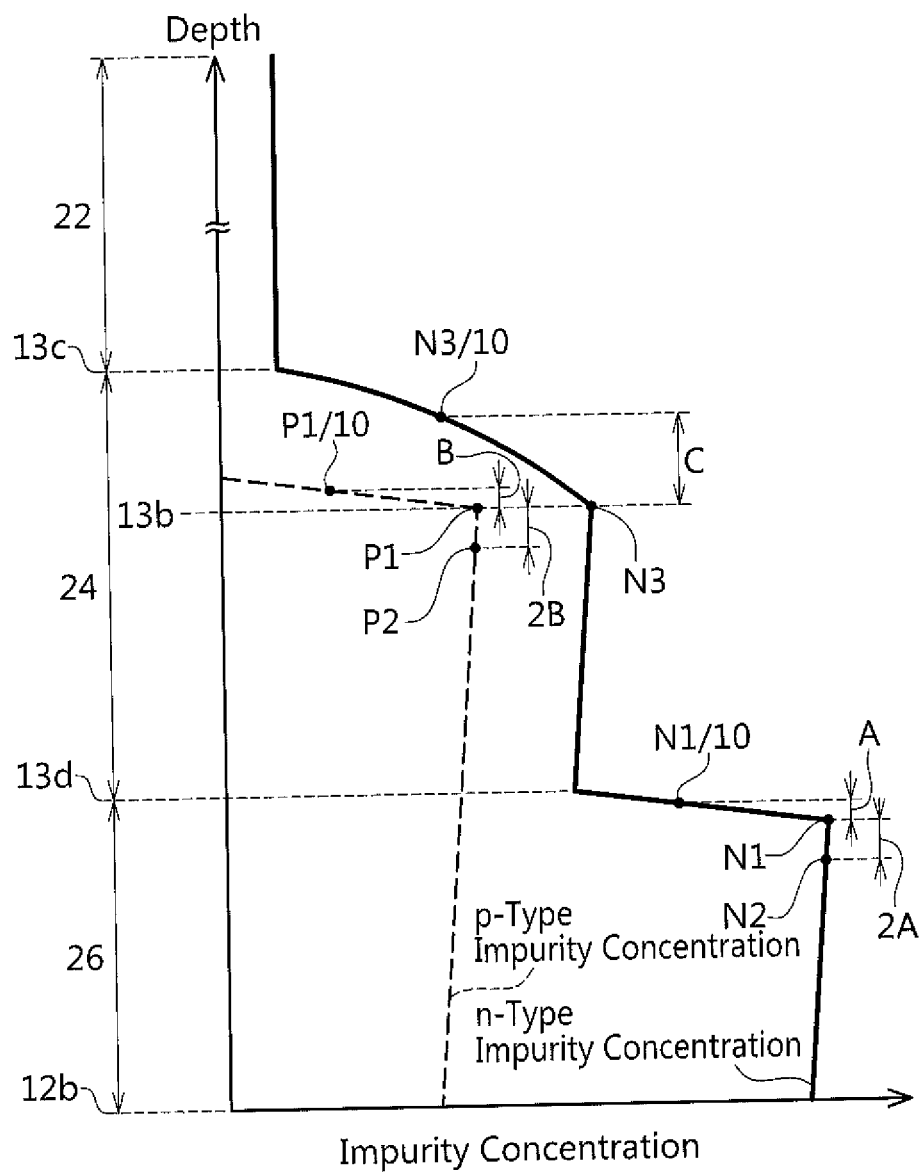
FIG. 2 is a graph that shows an impurity concentration distribution in a thickness direction in a drift region 22, a buffer region 24, and a cathode region 26.

FIG. 2 shows an impurity concentration distribution in the drift region 22, the buffer region 24, and the cathode region 26 in a thickness direction of the semiconductor substrate 12 (i.e., an impurity concentration distribution along a line II-II in FIG. 1). Notably, a horizontal axis in FIG. 2 represents the impurity concentration logarithmically. In the cathode region 26, the n-type impurity concentration extremely gradually increases from the lower surface 12b toward a deeper side (an upper surface 12a side), and reaches a peak concentration N1 at a predetermined depth. On the deeper side than the depth having the peak concentration N1, the n-type impurity concentration sharply decreases toward the buffer region 24. In the buffer region 24, the n-type impurity concentration extremely gradually increases from a boundary with the cathode region 26 toward the deeper side, and reaches a peak concentration N3 at a predetermined depth 13b. On the deeper side than the depth having the peak concentration N3, the n-type impurity concentration sharply decreases toward the drift region 22. In this region in which the n-type impurity concentration sharply decreases, a graph of the n-type impurity concentration curves in a convex manner toward a plus side of the n-type impurity concentration as shown in FIG. 2. A boundary 13c between the buffer region 24 and the drift region 22 is positioned at a depth apart from the lower surface 12b of the semiconductor substrate 12 by 2.0 μm or more and 4.0 μm or less. In the drift region 22, the n-type impurity concentration is approximately constant irrespective of the depth. Moreover, in the cathode region 26 and the buffer region 24, p-type impurities are distributed in a low concentration. The p-type impurity concentration extremely gradually increases from the lower surface 12b toward the deeper side, and reaches a peak concentration P1 at the predetermined depth 13b in the buffer region 24. The peak concentration P1 is provided at approximately the same depth as the peak concentration N3. On the deeper side than the depth having the peak concentration P1, the p-type impurity concentration sharply decreases toward the drift region 22. In the drift region 22, the p-type impurity concentration is approximately zero.

A part of the region in which the n-type impurity concentration sharply changes in the cathode region 26 has a concentration N1/10 (a concentration that is one tenth of the peak concentration N1). Moreover, a distance A in FIG. 2 indicates a distance from the depth having the peak concentration N1 to a depth having the concentration N1/10. Moreover, a concentration N2 in FIG. 2 indicates an n-type impurity concentration at a depth shallower (on a lower surface 12b side) by a distance 2A (a distance that is twice the distance A) than the depth having the peak concentration N1. As is clear from FIG. 2, the concentration N2 is higher than the concentration N1/10.

A part of the region in which the p-type impurity concentration sharply changes in the buffer region 24 has a concentration P1/10 (a concentration that is one tenth of the peak concentration P1). Moreover, a distance B in FIG. 2 indicates a distance from the depth having the peak concentration P1 to a depth having the concentration P1/10. Moreover, a concentration P2 in FIG. 2 indicates a p-type impurity concentration at a depth shallower by a distance 2B (a distance that is twice the distance B) than the depth having the peak concentration P1. As is clear from FIG. 2, the concentration P2 is higher than the concentration P1/10.

A part of the region in which the n-type impurity concentration sharply changes in the buffer region 24 has a concentration N3/10 (a concentration that is one tenth of the peak concentration N3). Moreover, a distance C in FIG. 2 indicates a distance from the depth having the peak concentration N3 to a depth having the concentration N3/10. As is clear from FIG. 2, the distance C is greater than the distance B. That is, a slope of the n-type impurity concentration on the deeper side than the depth having the peak concentration N3 is gentler than a slope of the p-type impurity concentration on the deeper side than the depth having the peak concentration P1.

When a voltage that makes the upper electrode 14 positive (i.e., a forward voltage) is applied to between the upper electrode 14 and the lower electrode 16, the diode is turned on. Afterwards, a voltage that makes the lower electrode 16 positive (i.e., a reverse voltage) is applied to between the upper electrode 14 and the lower electrode 16, the diode performs a reverse recovery operation. That is, a depletion layer extends from a boundary between the anode region 20 and the drift region 22 into the drift region 22, causing holes that exist in the drift region 22 to be discharged to the upper electrode 14. A reverse current thereby flows temporarily in the diode. The buffer region 24 has a high n-type impurity concentration, and hence the depletion layer stops in the buffer region 24. Here, as shown in FIG. 2, the slope along which the n-type impurity concentration in the buffer region 24 changes in a vicinity of the boundary between the drift region 22 and the buffer region 24 is gentler than the slope along which the p-type impurity concentration in the buffer region 24 changes in the vicinity of that boundary (in other words, the distance C is greater than the distance B). Accordingly, when the depletion layer enters the buffer region 24, the depletion layer gradually stops in the buffer region 24. This restrains a noise generated when the diode performs the reverse recovery operation.

Next, a method of manufacturing the semiconductor device 10 will be described. Notably, this manufacturing method is characterized in processes of forming the buffer region 24 and the cathode region 26, and hence these processes will be described in further details.

Figure 3:
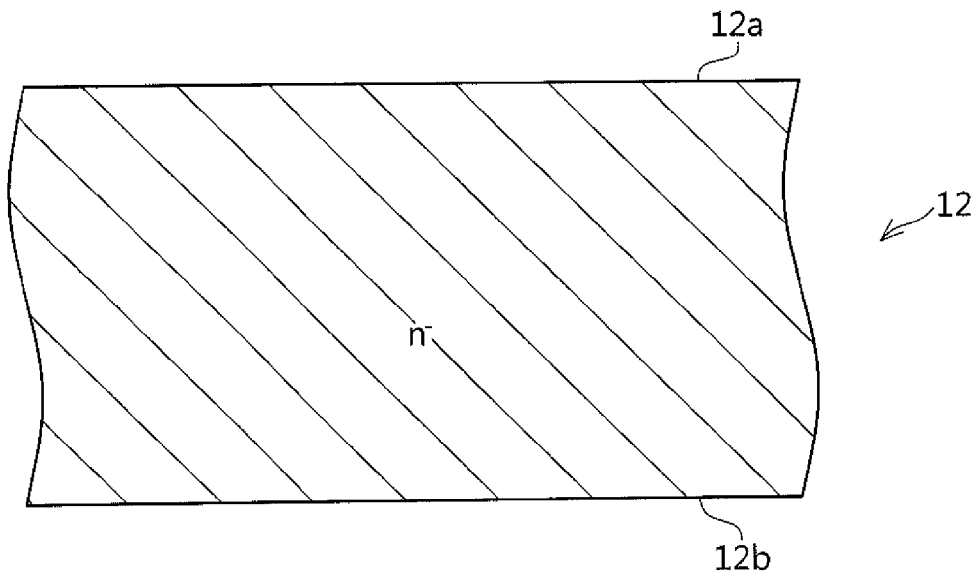
FIG. 3 is a vertical cross-sectional view of a semiconductor substrate 12 in a manufacturing process of the semiconductor device 10.
Figure 4:
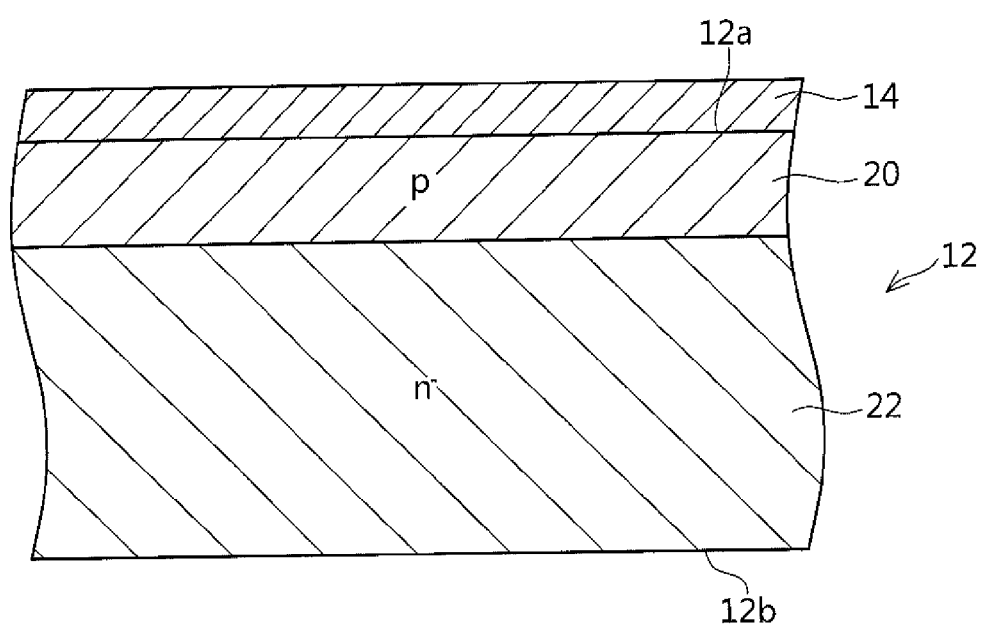
FIG. 4 is a vertical cross-sectional view of the semiconductor substrate 12 in a manufacturing process of the semiconductor device 10.

Initially, the semiconductor substrate 12 made of n-type silicon shown in FIG. 3 is prepared. An entirety of the semiconductor substrate 12 has approximately the same n-type impurity concentration as that of the drift region 22. Next, p-type impurities (boron or the like) are implanted into the upper surface 12a of the semiconductor substrate 12 by an ion implantation, to thereby form the anode region 20. Next, the upper electrode 14 is formed on the upper surface 12a of the semiconductor substrate 12 by vapor deposition. The semiconductor substrate 12 is thereby brought into a state shown in FIG. 4.

(First Implantation Process)

Figure 5:
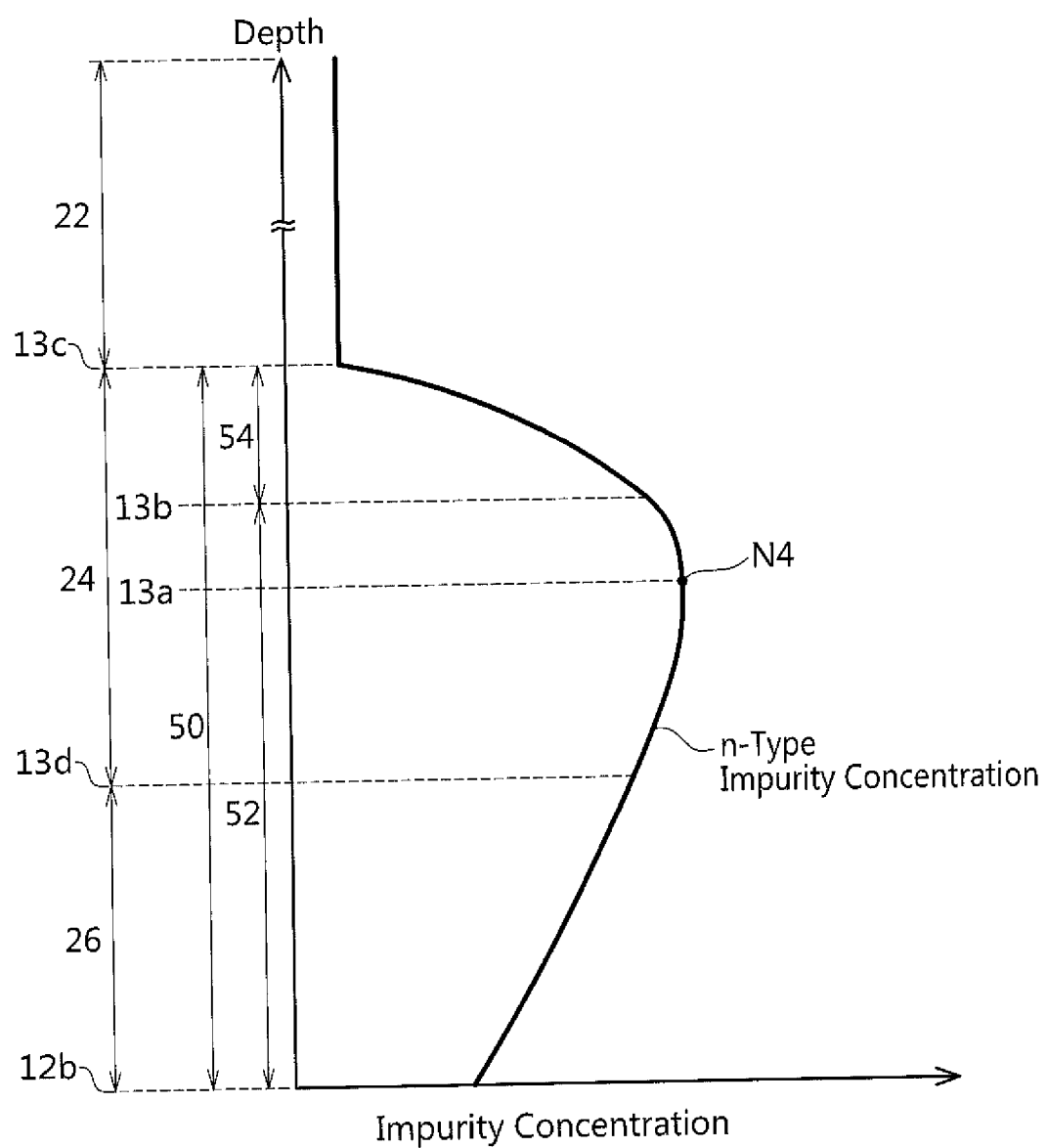
FIG. 5 is a graph that shows an impurity concentration distribution in regions corresponding to FIG. 2 after a first implantation process.

Next, n-type impurities (phosphorus or the like) are implanted toward the lower surface 12b of the semiconductor substrate 12 by an ion implantation. That is, the n-type impurities are implanted into the semiconductor substrate 12 from the lower surface 12b. Here, the n-type impurities are implanted by a channeling implantation. The channeling implantation is an ion implantation performed so as to cause channeling in the semiconductor substrate 12. For example, the channeling can be caused by conducting an ion implantation under a condition of a tilt angle of 0 degrees and a twist angle of 0 degrees. After the channeling implantation, the impurity concentration distribution in the semiconductor substrate 12 becomes a distribution as shown in FIG. 5. By the channeling implantation, the p-type impurities can be implanted up to a deep position of the buffer region 24 with a low acceleration energy. Moreover, by the channeling implantation, as shown in FIG. 5, the n-type impurities can be implanted into a wide region 50 that includes a depth range corresponding to the cathode region 26 and a depth range corresponding to the buffer region 24. That is, the region 50 is an increased region in which the n-type impurity concentration was increased in the first implantation process. Moreover, at this stage, a peak value N4 of the n-type impurity concentration shown in FIG. 5 is formed. A depth 13a having the peak value N4 is positioned in the depth range corresponding to the buffer region 24.

Figure 6:
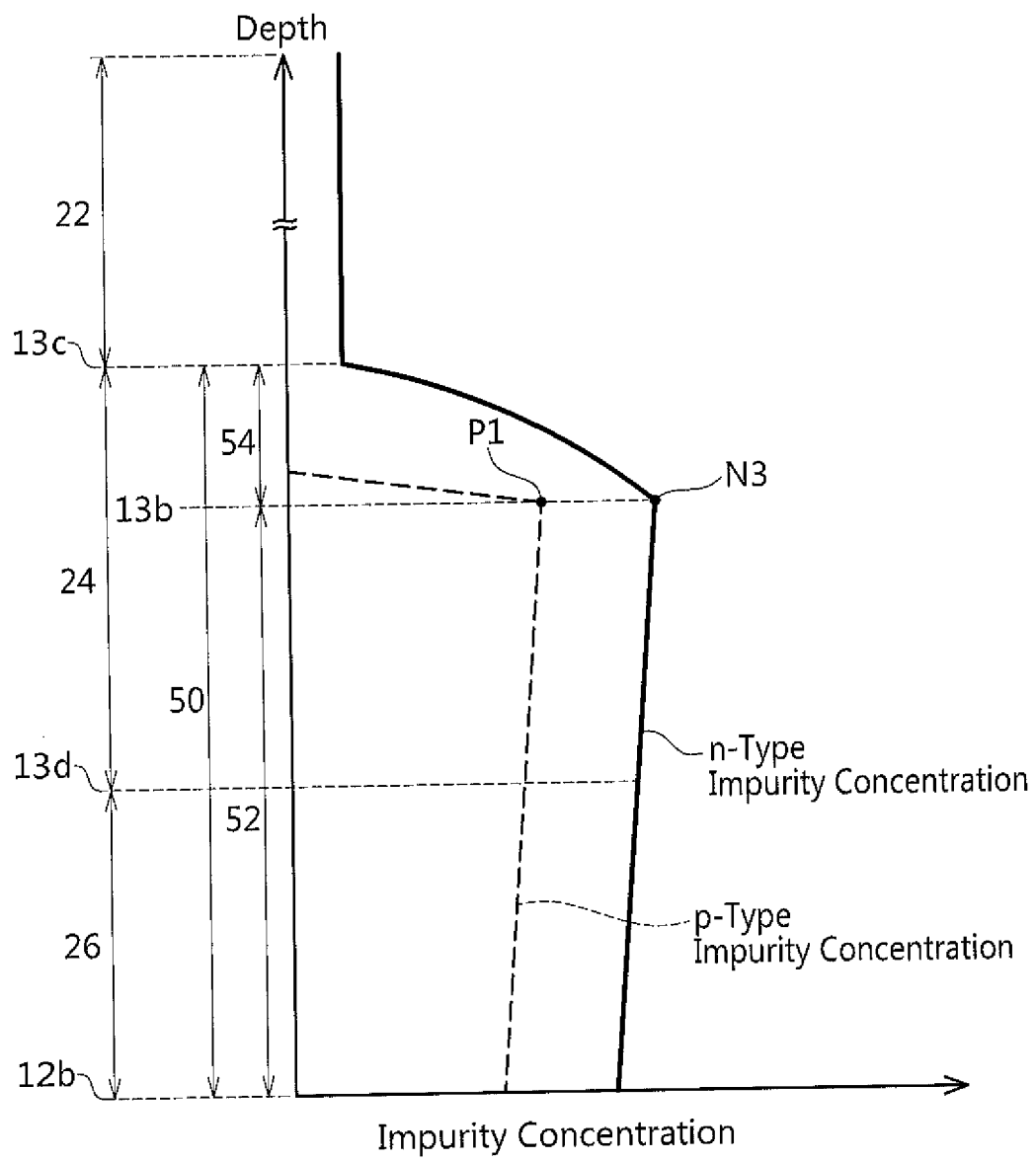
FIG. 6 is a graph that shows an impurity concentration distribution in the regions corresponding to FIG. 2 after a first melting process.

(First Melting Process) Next, the semiconductor substrate 12 is annealed by laser annealing. Here, the lower surface 12b of the semiconductor substrate 12 is irradiated with a laser to thereby locally anneal a vicinity of the lower surface 12b. More specifically, a semiconductor layer in a region 52 between the lower surface 12b of the semiconductor substrate 12 and the depth 13b in FIG. 5 is melted. The depth 13b is positioned on the deeper side than the depth 13a. Moreover, the depth 13c in FIG. 5 represents an end (a deeper side end) of the increased region 50 in which the n-type impurity concentration was increased in the first implantation process. The depth 13b is positioned on a shallower side than the depth 13c. After the completion of the laser annealing, the semiconductor layer in the region 52 which was melted is solidified. When the semiconductor layer in the region 52 is melted and then solidified as such, the n-type impurities in the region 52 are activated. Moreover, the n-type impurities move during the melting. Accordingly, as shown in FIG. 6, the n-type impurity concentration distribution in the region 52 becomes flatter after the solidification than before the melting. This causes the peak concentration N4 in FIG. 5 to disappear, and the peak concentration N3 to be formed at the deeper side end 13b of the region 52. Moreover, in many cases, before the start of the first melting process, p-type impurities are unintentionally adhering to the lower surface 12b of the semiconductor substrate 12. When the region 52 is melted, the p-type impurities adhered to the lower surface 12b diffuse in the region 52. Accordingly, after the region 52 has been solidified, the p-type impurities come to be distributed in the region 52 as shown in FIG. 6. The p-type impurities are distributed approximately uniformly in the melted region 52, and sharply decrease on the deeper side than the region 52. This distribution of the p-type impurities is approximately equal to the distribution of the p-type impurities shown in FIG. 2. As described above, the n-type impurities and the p-type impurities come to be distributed in the region 52, but the n-type impurity concentration becomes higher than the p-type impurity concentration. This is because the region 52 that included the peak concentration N4 in FIG. 5 is melted and then solidified. Moreover, when the region 52 is melted and then solidified as such, most part of crystal defects in the region 52 disappears. Moreover, in the first melting process, a region 54 which is a part of the increased region 50 on the deeper side than the region 52 is not melted, but heated. This also activates the n-type impurities in the region 54. Moreover, a minute amount of the p-type impurities diffuses from the region 52 to the region 54 during the melting. However, as shown in FIG. 6, the n-type impurity concentration becomes higher than the p-type impurity concentration in the region 54 as well. This is because the region 54 which is a part of the increased region 50 is not melted when the region 52 is melted, and hence the n-type impurity concentration is maintained at a high value in the region 54.

(Second Implantation Process) Next, the n-type impurities (phosphorus or the like) are implanted toward the lower surface 12b of the semiconductor substrate 12 by an ion implantation. That is, the n-type impurities are implanted into the semiconductor substrate 12 from the lower surface 12b. Here, the n-type impurities are implanted into the semiconductor substrate 12 at an angle which does not cause channeling. For example, the channeling can be avoided by conducting an ion implantation under a condition of a tilt angle of 7 degrees and a twist angle of 23 degrees. Here, the n-type impurities are implanted into a depth range shallower than the end 13b of the region 52 which was melted. More specifically, the n-type impurities are implanted into the depth range corresponding to the cathode region 26 in the vicinity of the lower surface 12b of the semiconductor substrate 12. The n-type impurity concentration at least in the lower surface 12b is thereby increased. After the second implantation process, the impurity concentration distribution in the semiconductor substrate 12 becomes a distribution shown in FIG. 7.

Figure 7:
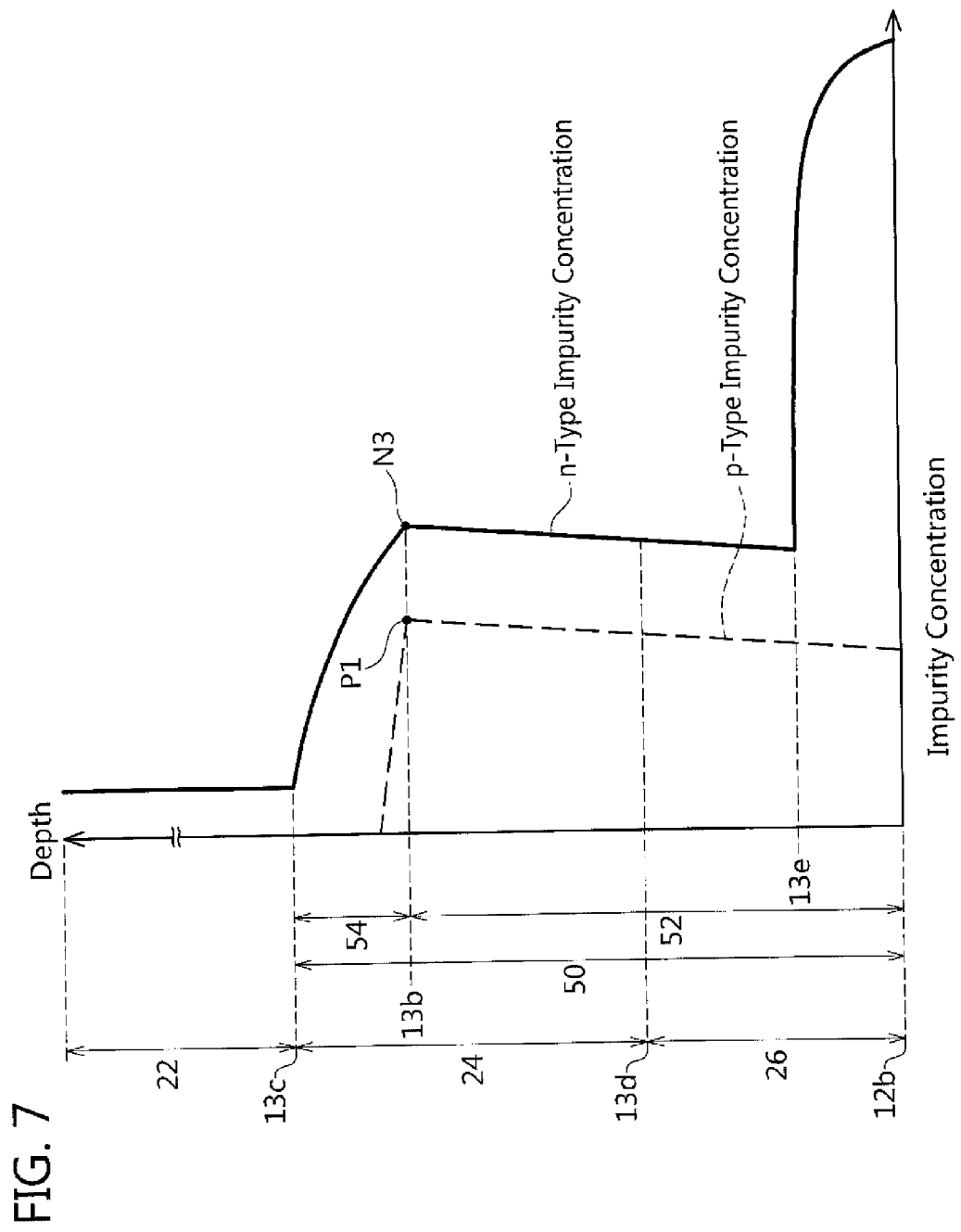
FIG. 7 is a graph that shows an impurity concentration distribution in the regions corresponding to FIG. 2 after a second implantation process.

(Second Melting Process) Next, the semiconductor substrate 12 is annealed by laser annealing. Here, the lower surface 12b of the semiconductor substrate 12 is irradiated with a laser to thereby locally anneal the vicinity of the lower surface 12b. More specifically, a semiconductor layer in a region between the lower surface 12b of the semiconductor substrate 12 and a depth 13d in FIG. 7 is melted. The depth 13d is positioned on the shallower side than the depth 13b. Moreover, the depth 13d is positioned on the deeper side than an end 13e (a deeper side end) of a region in which the n-type impurity concentration was increased in the second implantation process. After the completion of the laser annealing, the semiconductor layer in the region which was melted is solidified. In the solidified region, the n-type impurities are activated. The cathode region 26 is thereby formed. Moreover, the n-type impurities move and are uniformized during the melting, and hence as shown in FIG. 2, the re-type impurity distribution in the cathode region 26 becomes flatter after the solidification than before the melting. The peak concentration N5 shown in FIG. 2 is thereby formed.

Afterwards, the lower electrode 16 is formed on the lower surface 12b of the semiconductor substrate 12 by vapor deposition or the like, to thereby complete the semiconductor device 10 in FIG. 1.

By melting and then solidifying the region 52 as in the above-described manufacturing method, it is possible to obtain the p-type impurity concentration distribution in which the concentration P2 becomes higher than the concentration P1/10 as shown in FIG. 2. Moreover, by melting and then solidifying the cathode region 26 as in the above-described manufacturing method, it is possible to obtain the n-type impurity concentration distribution in which the concentration N2 becomes higher than the concentration N1/10 as shown in FIG. 2. Moreover, by melting the region 52 and not melting the region 54 in the increased region 50 as in the above-described manufacturing method, it is possible to obtain the distribution in which the distance C becomes greater than the distance B as shown in FIG. 2. Moreover, by not melting the region 54 as in the above-described manufacturing method, it is possible to obtain the n-type impurity concentration distribution that curves in a convex manner toward a plus side of the n-type impurity concentration in the region 54 as shown in FIG. 2.

Moreover, according to the above-described manufacturing method, crystal defects in the regions that were melted during the first melting and the second melting processes disappear, and hence it is possible to form the buffer region 24 and the cathode region 26 that have few crystal defects. It is therefore possible to form a low-loss diode.

Moreover, according to the above-described manufacturing method, the buffer region 24 can be formed at a deep position. Therefore, even if the lower surface 12b is scratched in the manufacturing processes, the scratch less easily reaches the drift region 22. Therefore, even if the lower surface 12b is scratched, a leakage current is less likely to occur in the diode.

Moreover, according to the above-described manufacturing method, the n-type impurities are implanted to a deep position by the channeling implantation, and hence there is no need to perform an n-type impurity implantation with a high energy. Accordingly, the need for a high-energy impurity implantation device is eliminated, and hence the semiconductor device 10 can be manufactured at low cost.

Moreover, according to the above-described manufacturing method, the buffer region 24 is activated in the first melting process, and the cathode region 26 is activated in the second melting process. Accordingly, there is no need to perform a non-melting type annealing on the buffer region 24 and the cathode region 26, and hence the need for a non-melting type annealing device is eliminated. A common annealing device (a melting type annealing device) can be used for forming both of the buffer region 24 and the cathode region 26. This can also reduce process cost.

Moreover, according to the above-described manufacturing method, the p-type impurity concentration does not unintentionally become higher than the n-type impurity concentration in the drift region 22, the buffer region 24, and the cathode region 26. That is, unintentional formation of a p-type region is avoided. Therefore, the diode can stably be manufactured. This will hereinafter be described in further details with use of comparative examples.

Figure 8:
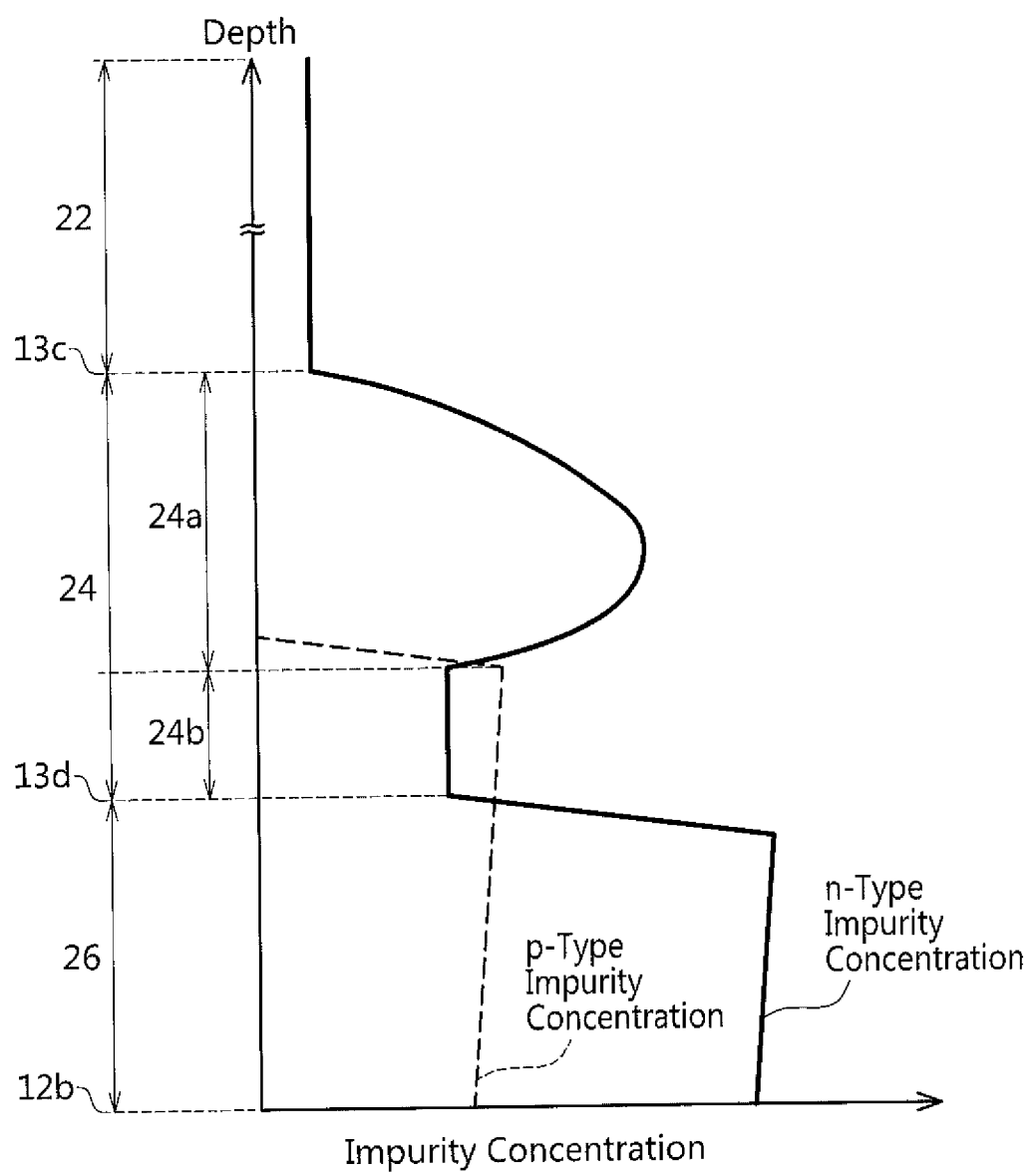
FIG. 8 is a graph that shows an impurity concentration in regions corresponding to FIG. 2 in a semiconductor device in a comparative example.
Figure 9:
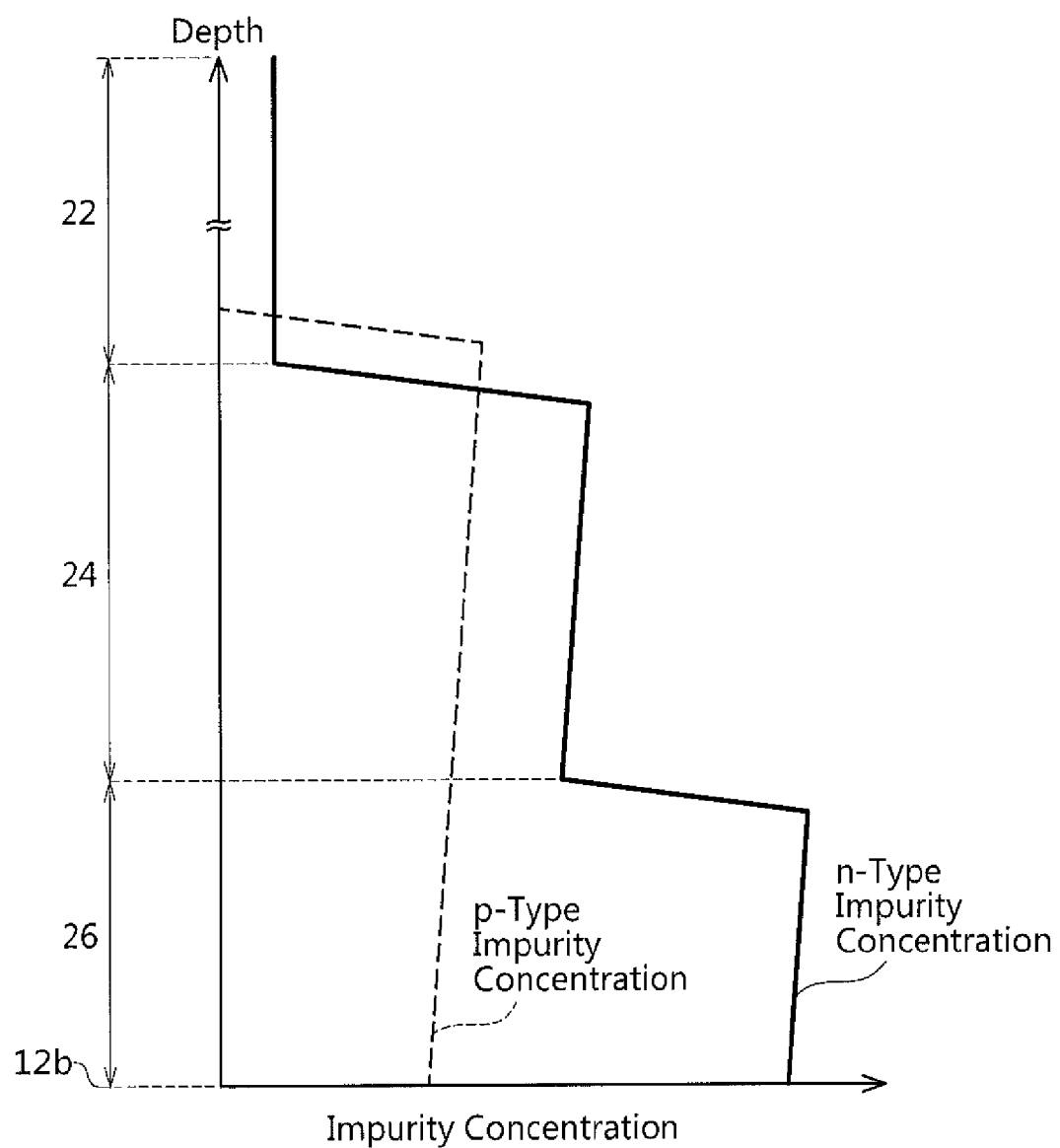
FIG. 9 is a graph that shows an impurity concentration in regions corresponding to FIG. 2 in a semiconductor device in another comparative example.

Each of FIGS. 8 and 9 has an n-type impurity concentration distribution in a semiconductor device of a comparative example. The semiconductor device that has the distribution in FIG. 8 was manufactured by melting only a region shallower than the depth having the peak concentration N4 (see FIG. 5) in the first melting process. Accordingly, the n-type impurity concentration is high in a region 24a of the buffer region 24 which was not melted, while the n-type impurity concentration is low in a region 24b of the buffer region 24 which was melted. As described above, if the n-type impurity concentration is low in the region 24b which is a part of the buffer region 24, there may be a case where the p-type impurity concentration becomes higher than the n-type impurity concentration in the region 24b as shown in FIG. 8. Accordingly, in the semiconductor device in FIG. 8, a part of the buffer region 24 is undesirably turned into the p-type.

The semiconductor device that has the distribution in FIG. 9 was manufactured by performing the melting up to a position deeper than the end 13c of the increased region 50 (see FIG. 5) in the first melting process. In such a manufacturing method, there may be a case where the p-type impurities diffuse over into the drift region 22 in the first melting process, and hence as shown in FIG. 9, there may be a case where the p-type impurity concentration becomes higher than the n-type impurity concentration in the drift region 22 in a vicinity of the buffer region 24. Accordingly, in the semiconductor device in FIG. 9, a part of the drift region 22 is undesirably turned into the p-type. If a p-type region is formed in a region in which a p-type region was not intended to be formed as in FIGS. 8 and 9, a Vf (forward voltage) of the diode increases, which is problematic.

In contrast to this, according to the manufacturing method of the embodiment, the semiconductor device 10 can stably be manufactured without causing the problem as in the semiconductor devices in FIGS. 8 and 9.

Figure 10:
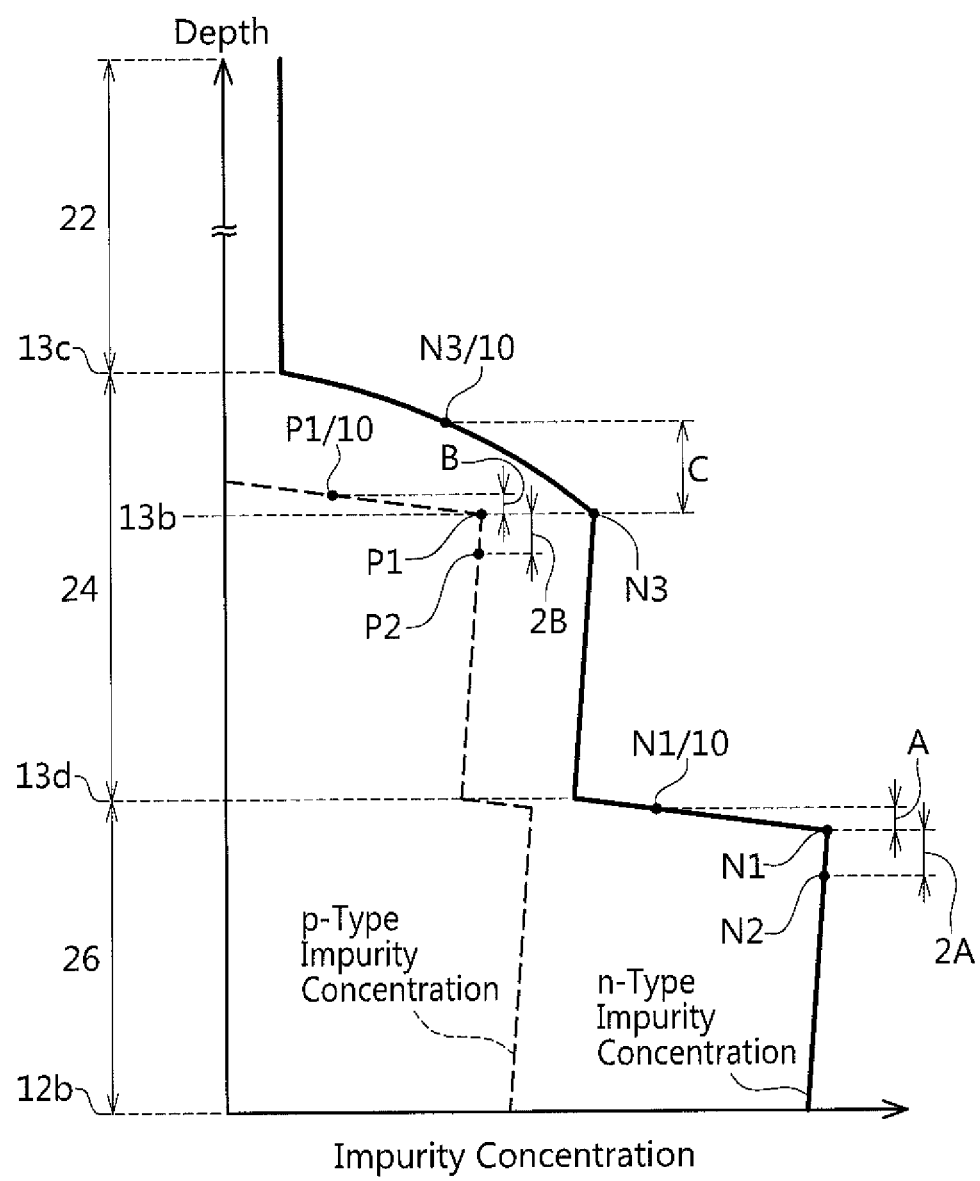
FIG. 10 is a graph that shows an impurity concentration in regions corresponding to FIG. 2 in a semiconductor device in a variation.

Notably, in the above-mentioned embodiment, the p-type impurity concentration distribution did not change in the second melting process. However, if p-type impurities adhere again to the lower surface 12b of the semiconductor substrate 12 after the first melting process and before the second melting process, the p-type impurities diffuse again in the melted region in the second melting process. In this case, the impurity concentration in the semiconductor device 10 becomes the one as shown in FIG. 10. That is, the p-type impurity concentration becomes high in the cathode region 26. However, the n-type impurity concentration in each of the cathode region 26 and the buffer region 24 is sufficiently high, and hence even if the p-type impurity concentration becomes high in the cathode region 26, no significant problem occurs.

Moreover, in the above-mentioned embodiment, the n-type impurities were implanted into the wide range corresponding to the buffer region 24 and the cathode region 26 in the first implantation process. However, as shown in FIG. 11, the first implantation process may be performed such that the n-type impurity concentration is increased only at a deep position. In this case as well, a semiconductor device that has the impurity concentration distribution approximately similar to that in FIG. 2 can be manufactured by performing the melting up to the depth 13b which is deeper than the depth 13a having the peak concentration N4, and shallower than the deeper side end 13c of the increased region 50 in the first melting process. Nevertheless, it should be noted that implanting the n-type impurities into a wide depth range as in the above-mentioned embodiment (see FIG. 5) makes the n-type impurity concentration more uniform in the region that was melted and then solidified. Moreover, implanting the n-type impurities into the wide depth range as in the above-mentioned embodiment makes a slope of the n-type impurity concentration in a boundary portion between the drift region 22 and the buffer region 24 gentler, and hence a noise becomes less likely to occur during the reverse recovery operation. Moreover, although the n-type impurities can be implanted into the buffer region 24 with a low energy by the channeling implantation in the method of the above-mentioned embodiment, in a case of obtaining the distribution in FIG. 11, it is necessary to implant the n-type impurities with a high energy by an implantation that causes no channeling.

Notably, in the above-mentioned embodiment, the semiconductor device comprising a diode has been described. However, the art disclosed herein may be applied to a buffer region and a cathode region of a diode in a semiconductor device including an IGBT and the diode (i.e., a so-called RC-IGBT). Moreover, the art disclosed herein may be applied to a drain region and a buffer region in a MOSFET. Moreover, in the above-mentioned embodiment, the aspect in which n-type impurities are implanted into an n-type semiconductor substrate has been described. However, the above-described art may be applied when p-type impurities are implanted into a p-type semiconductor substrate.

Specific examples of the present invention have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A method of manufacturing a semiconductor device, the method comprising:
   a first implantation of implanting first conductivity type impurities into a semiconductor substrate of a first conductivity type from a surface of the semiconductor substrate;
   melting and then solidifying a first semiconductor region between a specific depth and the surface, the specific depth being deeper than a depth having a peak concentration of the first conductivity type impurities in an increased region in which a first conductivity type impurity concentration was increased in the first implantation, and the specific depth being shallower than a deeper side end of the increased region;

a second implantation of implanting, from the surface, the first conductivity type impurities into a region shallower than the specific depth; and melting and then solidifying a region in which the first conductivity type impurity concentration was increased in the second implantation.

2. The method of claim 1, wherein the first conductivity type impurity concentration is increased in a range between the deeper side end and the surface in the first implantation.

3. The method of claim 2, wherein the first conductivity type impurities are implanted by a channeling implantation in the first implantation.

4. A semiconductor device, comprising:

a high concentration region of a first conductivity type provided in a range exposed on a surface of a semiconductor substrate;

a middle concentration region of the first conductivity type provided in a range deeper than the high concentration region, and having a first conductivity type impurity concentration which is lower than that of the high concentration region; and a low concentration region of the first conductivity type provided in a range deeper than the middle concentration region, and having the first conductivity type impurity concentration which is lower than that of the middle concentration region, wherein a distance A is a distance from a depth having a peak value of the first conductivity type impurity concentration in the high concentration region to a depth deeper than the depth having the peak value of the first conductivity type impurity concentration, and having the first conductivity type impurity concentration which is one tenth of the peak value of the first conductivity type impurity concentration, the first conductivity type impurity concentration at a depth shallower by twice the distance A than the depth having the peak value of the first conductivity type impurity concentration is equal to or higher than one tenth of the peak value of the first conductivity type impurity concentration, a distance B is a distance from a depth having a peak value of the second conductivity type impurity concentration in the middle concentration region to a depth deeper than the depth having the peak value of the second conductivity type impurity concentration, and having which is one tenth of the peak value of the second conductivity type impurity concentration, the second conductivity type impurity concentration at a depth shallower by twice the distance B than the depth having the peak value of the second conductivity type impurity concentration is equal to or higher than one tenth of the peak value of the second conductivity type impurity concentration, a distance C is a distance from a depth having a peak value of the first conductivity type impurity concentration in the middle concentration region to a depth deeper than the depth having the peak value of the first conductivity type impurity concentration in the middle concentration region, and having the first conductivity type impurity concentration which is one tenth of the peak value of the first conductivity type impurity concentration in the middle concentration region, and the distance C is greater than the distance B.

5. The semiconductor device of claim 4, wherein the first conductivity type impurity concentration continuously decreases from the depth having the peak value of the first conductivity type impurity concentration in the middle concentration region toward a deeper side, and a graph of the first conductivity type impurity concentration in a part where the first conductivity type impurity concentration continuously decreases curves in a convex manner toward a plus side of the first conductivity type impurity concentration.

* * * * *